United States Patent
Koole et al.

(10) Patent No.: US 11,454,810 B2
(45) Date of Patent: Sep. 27, 2022

(54) REDUCING INTERFERENCE BETWEEN ELECTROMAGNETIC TRACKING SYSTEMS

(71) Applicant: Northern Digital Inc., Waterloo (CA)

(72) Inventors: Thomas Koole, Kitchener (CA); Marc Cameron, Enfield (CA); Joel McCartney, Kitchener (CA)

(73) Assignee: Northern Digital Inc., Waterloo (CA)

( * ) Notice: Subject to any disclaimer, the term of this patent is extended or adjusted under 35 U.S.C. 154(b) by 0 days.

(21) Appl. No.: 17/125,151

(22) Filed: Dec. 17, 2020

(65) Prior Publication Data

US 2021/0199959 A1 Jul. 1, 2021

Related U.S. Application Data

(60) Provisional application No. 62/955,048, filed on Dec. 30, 2019.

(51) Int. Cl.
*G01R 33/00* (2006.01)
*H04W 72/04* (2009.01)
(Continued)

(52) U.S. Cl.
CPC ......... *G02B 27/0093* (2013.01); *G01R 33/00* (2013.01); *G01R 33/0041* (2013.01);
(Continued)

(58) Field of Classification Search
CPC ............................ G01R 33/00; G01R 33/0041; G02B 27/0093; G02B 27/0172; G06F 3/011;
(Continued)

(56) References Cited

U.S. PATENT DOCUMENTS 6,624,626 B2 * 9/2003 Khalfin ................ G02B 27/017
324/207.17
7,158,754 B2 1/2007 Anderson
(Continued)

FOREIGN PATENT DOCUMENTS

AU 2015201655 10/2015
CA 2695841 11/2016
(Continued)

OTHER PUBLICATIONS

Argenox.com [online], "BLE Advertising Primer," Dec. 26, 2019, retrieved on Mar. 16, 2021, retrieved from URL <argenox.com/library/Bluetooth-low-energy/bleadvertising-primer/>, 8 pages.
(Continued)

*Primary Examiner* — Mihir K Rayan
(74) *Attorney, Agent, or Firm* — Fish & Richardson P.C.

(57) ABSTRACT

A method of reducing a chance of interference between operations of two electromagnetic systems (e.g., AR/VR systems) is provided. The method includes determining one or more first frequencies at which a first electromagnetic system is operating, identifying one or more second frequencies that do not interfere with the determined one or more first frequencies, and setting a second electromagnetic system to operate at the identified one or more second frequencies. Each of the first and the second electromagnetic systems includes a respective magnetic transmitter configured to generate magnetic fields, and a respective magnetic sensor configured to generate signals based on characteristics of the magnetic fields received at the magnetic sensor (e.g., from the respective magnetic transmitter).

16 Claims, 5 Drawing Sheets

(51) Int. Cl.
*G02B 27/00* (2006.01)
*G06T 19/00* (2011.01)
*G06F 3/01* (2006.01)
*G02B 27/01* (2006.01)

(52) U.S. Cl.
CPC ......... *G02B 27/0172* (2013.01); *G06F 3/012* (2013.01); *G06T 19/006* (2013.01); *H04W 72/0453* (2013.01)

(58) Field of Classification Search
CPC ......... G06F 3/012; G06T 19/006; H04K 3/42; H04K 3/62; H04K 3/90; H04W 72/0453
See application file for complete search history.

(56) References Cited

U.S. PATENT DOCUMENTS

| | | | |
|---|---|---|---|
| 7,321,228 B2 | 1/2008 | Govari | |
| 7,436,802 B2 * | 10/2008 | Lee | H04L 5/023 375/E1.035 |
| 7,542,869 B2 * | 6/2009 | Gandelsman | G06F 3/0346 702/152 |
| 7,738,876 B1 * | 6/2010 | Radhakrishnan | H04W 48/20 455/67.11 |
| 8,049,617 B2 | 11/2011 | Culpepper et al. | |
| 8,138,918 B2 | 3/2012 | Habib et al. | |
| 9,636,188 B2 | 5/2017 | Gattani et al. | |
| 10,151,606 B1 * | 12/2018 | Memarzanjany | G01D 5/2046 |
| 10,378,921 B2 | 8/2019 | Pedrotti et al. | |
| 10,439,444 B2 | 10/2019 | Wight et al. | |
| 2006/0061354 A1 * | 3/2006 | Wallance | G06F 3/0346 324/207.15 |
| 2008/0158180 A1 * | 7/2008 | Krah | G06F 3/048 345/173 |
| 2014/0295778 A1 * | 10/2014 | Tsai | H04B 15/00 455/78 |
| 2016/0015292 A1 | 1/2016 | Lorraine et al. | |
| 2017/0307891 A1 | 10/2017 | Bucknor et al. | |
| 2018/0128589 A1 * | 5/2018 | Mathkar | B23K 37/00 |
| 2018/0168738 A1 | 6/2018 | Viswanathan et al. | |
| 2018/0224508 A1 | 8/2018 | Kelly et al. | |
| 2019/0242952 A1 * | 8/2019 | Schneider | G01R 33/025 |
| 2019/0257672 A1 * | 8/2019 | Khalfin | G01D 5/208 |
| 2019/0353745 A1 * | 11/2019 | Zur | G01S 5/021 |

FOREIGN PATENT DOCUMENTS

| | | |
|---|---|---|
| EP | 3319066 | 5/2018 |
| KR | 20180135080 | 12/2018 |

OTHER PUBLICATIONS

Paterna et al., "A Bluetooth Low Energy Indoor Positioning System with Channel Diversity, Weighted Trilateration and Kalman Filtering," Sensors, Dec. 17, 2017, 2927; pp. 1-32.

* cited by examiner

REDUCING INTERFERENCE BETWEEN ELECTROMAGNETIC TRACKING SYSTEMS

CLAIM OF PRIORITY

This application claims priority under 35 USC § 119(e) to U.S. Patent Application Ser. No. 62/955,048, filed on Dec. 30, 2019, the entire contents of which are hereby incorporated by reference.

TECHNICAL FIELD

This disclosure relates to reducing interference, for example, reducing interference between Electromagnetic Tracking (EMT) systems.

BACKGROUND

Augmented Reality (AR) and Virtual Reality (VR) systems can use Electromagnetic Tracking (EMT) systems to aid location of devices in various contexts (e.g., gaming, medical, etc.). Such systems utilize a magnetic transmitter in proximity to a magnetic sensor such that the sensor and the transmitter can be spatially located relative to each other. Interference can occur when multiple systems in proximity to each other use the same or similar frequencies, and such interference can cause the system to report incorrect pose information for the sensor or transmitter.

SUMMARY

Electromagnetic Tracking (EMT) systems, including those that are employed as part of an Augmented Reality (AR) and/or a Virtual Reality (VR) system, can employ one or more techniques for improving the determination of the position and orientation of a magnetic sensor relative to a magnetic transmitter. For example, one or more techniques may be employed to reduce/eliminate pose errors caused by interference due to multiple systems using the same or similar operational frequencies. To ensure that the transmitter and sensor can provide accurate position and orientation measurements to the user, the operating frequencies of the systems can be selected such that the electromagnetic waves employed by the systems do not interfere with each other.

In general, in an aspect, a method includes determining one or more first frequencies at which a first electromagnetic system is operating, wherein the first electromagnetic system includes a magnetic transmitter configured to generate magnetic fields and a magnetic sensor configured to generate signals based on characteristics of the magnetic fields received at the magnetic sensor, identifying one or more second frequencies that do not interfere with the determined one or more first frequencies, and setting a second electromagnetic system to operate at the identified one or more second frequencies.

Implementations can include one or more of the following features in any combination.

In some implementations, the second frequencies are identified in response to determining that the second electromagnetic system operates at a frequency that is close enough to at least one of the first frequencies to cause an interference between operations of the first electromagnetic system and the second electromagnetic system.

In some implementations, the method also includes receiving, from the first electromagnetic system, a status signal, wherein information related to one or more first frequencies is included in the status signal, wherein the one or more second frequencies are identified based on the status signal.

In some implementations, the one or more second frequencies are identified in response to determining that a received signal strength indicator (RSSI) value corresponding to the status signal received from the first electromagnetic system is greater than a threshold value.

In some implementations, identifying the one or more second frequencies includes identifying a frequency that is greater than or less than at least one of the first one or more frequencies by at least a threshold amount.

In some implementations, identifying the one or more second frequencies includes using a frequency domain algorithm to scan for frequencies that will not interfere with the determined one or more frequencies.

In some implementations, the frequency domain algorithm is a Fast Fourier Transform (FFT).

In some implementations, setting the second electromagnetic system to operate at the identified one or more second frequencies includes repeatedly changing between the one or more second frequencies.

In some implementations, the one or more second frequencies are identified at least in part based on measurements received by an inertial measurement unit (IMU).

In some implementations, identifying the one or more second frequencies includes determining a divergence between a pose determined based on the magnetic fields and a pose determined based at least in part on measurements received from the IMU.

In some implementations, the one or more second frequencies are between 24 to 42 kHz.

In some implementations, the magnetic transmitter includes three coils each operating at a particular frequency.

In some implementations, the one or more frequencies are identified between every 20 milliseconds and every 10 seconds.

In general, in an aspect, a system includes a status sensor configured to receive a status signal from a first electromagnetic system, the first electromagnetic system including a magnetic transmitter configured to generate magnetic fields and a magnetic sensor configured to generate signals based on characteristics of the magnetic fields received at the magnetic sensor, and a computing device configured to determine, from the status signal, one or more first frequencies at which the first electromagnetic system is operating, identify one or more second frequencies that do not interfere with the determined one or more first frequencies, and send, to a magnetic transmitter of a second electromagnetic system, a request to operate at the identified one or more second frequencies.

Implementations can include one or more of the following features in any combination.

In some implementations, the computing device identifies the one or more second frequencies in response to determining that the second electromagnetic system operates at a frequency that is within a threshold value of at least one of the first frequencies such that an interference between operations of the first electromagnetic system and the second electromagnetic system would result.

In some implementations, the computing device is part of the second electromagnetic system.

In some implementations, the computing device is in wireless communication with one or both of the first electromagnetic system or the second electromagnetic system.

In some implementations, the status signal is generated by the first electromagnetic system and based on a communication protocol that has a communication range that is greater than a detection range of the magnetic fields generated by the magnetic transmitter of the first electromagnetic system. The systems and techniques described herein provide at least the following benefits. First, the systems prevent and/or reduce interference between EMT systems that work in proximity of each other. As disclosed herein, when an EMT system is turned on, the EMT system looks for frequencies that are not currently being used by other EMT systems and selects one or more frequencies from those free frequencies. Accordingly, the EMT system would not interfere with other systems that are already in the proximity of the EMT system.

Second, the EMT system prevents potential interferences that may be caused by other systems that are not initially in the EMT system's proximity, but may move into or towards the EMT system's proximity. While the EMT system is working, the EMT system continuously scans its environment for potential interference. If the EMT system finds that another system uses a frequency that the EMT system is already using, the EMT system changes its operating frequency to prevent interference and error in its measurements and/or operations.

Third, the EMT system is capable of detecting potential interferences before a system moves into the proximity (e.g., moves into the tracking environment) of the EMT system. The EMT system can include status transmitter(s) and sensor(s) that send out status information of the EMT system and receive status information of other systems, including what frequencies those systems are using. The status information can be transmitted as wireless signals that can travel further and/or be detected at a further destination from the EMT system relative to the distance that the EMT system's electromagnetic (EM) waves can be detected by other EMT systems at. Accordingly, before a first system moves into proximity of a second system to potentially cause interference on operations of the second system, the second system can detect the frequencies that the first system currently uses and take appropriate precautions to avoid an interference.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 3:
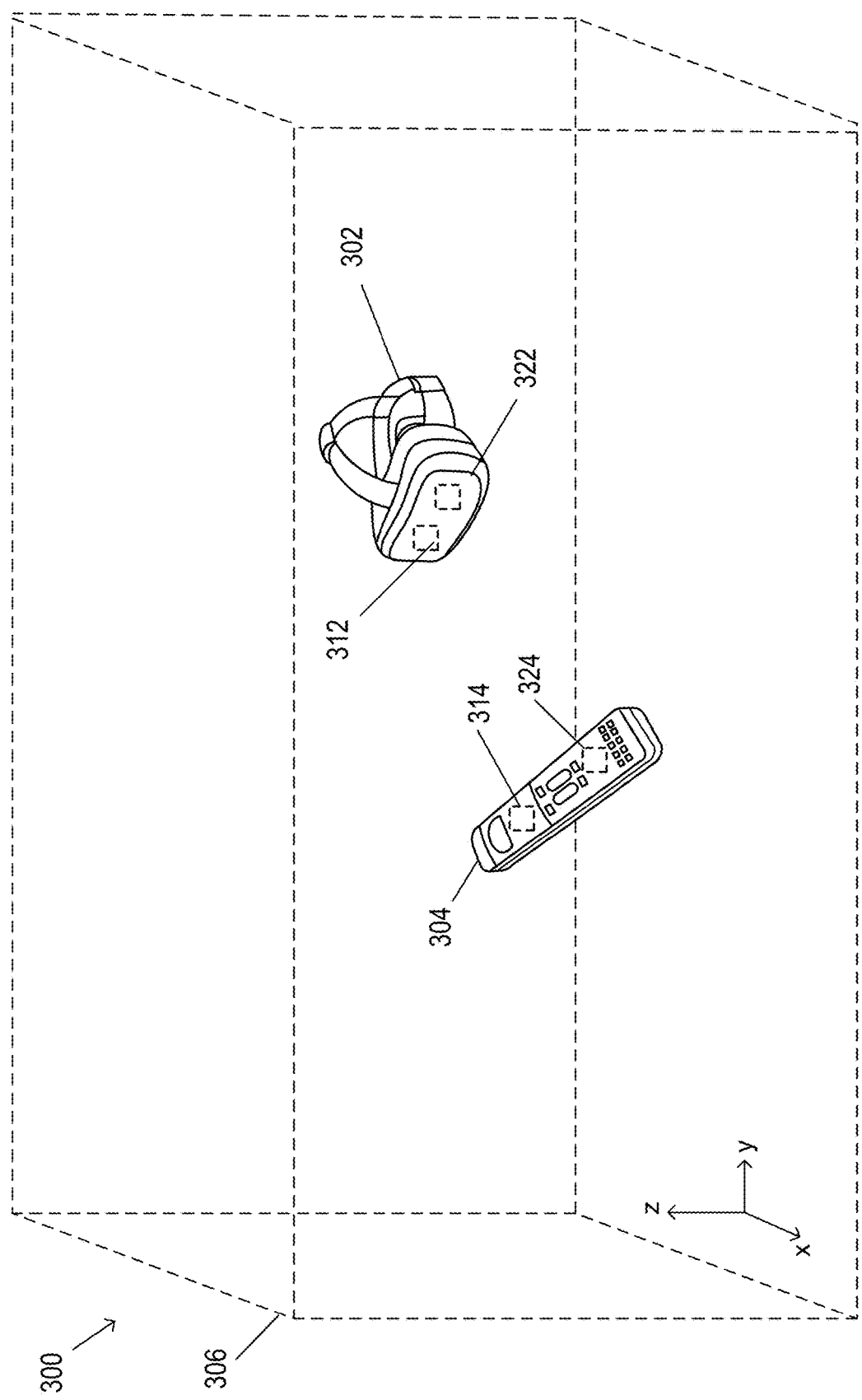
FIG. 3 shows an example EMT system that can be used as any of the EMT systems presented herein.

An Electromagnetic Tracking (EMT) system can be used in gaming and/or surgical settings to track devices (e.g., gaming controllers, head-mounted displays, medical equipment, robotic arms, etc.), thereby allowing their respective three-dimensional positions and orientations to be known to a user of the system. AR and VR systems also use EMT systems to perform head, hand, and body tracking, for example, to synchronize the user's movement with the AR/VR content. Such systems use a magnetic transmitter in proximity to a magnetic sensor to determine the pose (e.g., the position and orientation) of the sensor relative to the transmitter. FIG. 3, which is described in more detail below, illustrates an example EMT system 300, including a magnetic (e.g., electromagnetic) sensor 312 and a magnetic (e.g., electromagnetic) transmitter 314.

Such systems can employ one or more techniques for improving the determination of the pose of the sensor relative to the transmitter. For example, one or more techniques may be employed to reduce/eliminate pose errors caused by interference due to multiple EMT systems being in proximity to each other using the same or similar operational frequencies. For example, a first EMT system operating at frequency x may be in proximity to a second EMT system also operating at frequency x. The electromagnetic waves generated by each EMT system may interfere with each other, thereby causing distortions in the electromagnetic waves detected by sensors of each system. The distorted electromagnetic waves manifest as errors in the determined pose of the sensors relative to the transmitters. As a result, erroneous pose results are reported by one or both of the EMT systems.

To ensure that the transmitter and sensor can provide accurate position and orientation measurements to a user, the operating frequencies of the systems can be selected such that the electromagnetic waves employed by the systems do not interfere with each other. For example, at start-up, one of the EMT systems may detect that another EMT system is already operating in sufficiently close proximity, and in response, select a frequency that will not result in interference between the two systems. Continuing with the example above, the EMT system may detect that frequency x is already being used by another EMT system, and in response, select a different frequency y at which to operate. Due to the different frequencies employed by the two systems, interference is minimized and/or eliminated, and each EMT system is permitted to provide accurate pose results.

It should be noted that two frequencies do not have to exactly match each other to cause an interference in two systems operating on those frequencies. Rather, a first frequency used by a first system may be close enough to a second frequency used by a second system so that magnetic waves generated by the first system at the first frequency distort magnetic waves generated by the second system at the second frequency. To ensure that the frequencies of a first system and a second system do not interfere with each other, each frequency used by the first system may be selected to be greater than or less than each frequency used by the second system by at least a threshold amount (e.g., 100-300 Hz). In some implementations, the transmitter runs a triplet of frequencies that are 187.5 Hz apart, with each triplet being separated by a value of 281.25 Hz, although various other implementations are just as suitable.

Figure 1A:
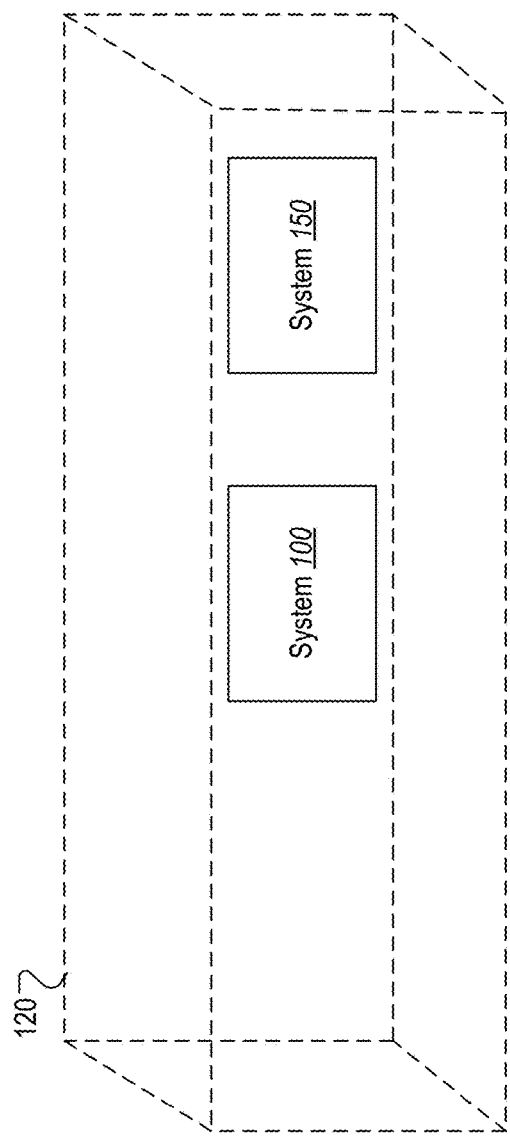
FIGS. 1A and 1B illustrate schematic views of two electromagnetic tracking (EMT) systems according to implementations of the present disclosure.
Figure 1B:
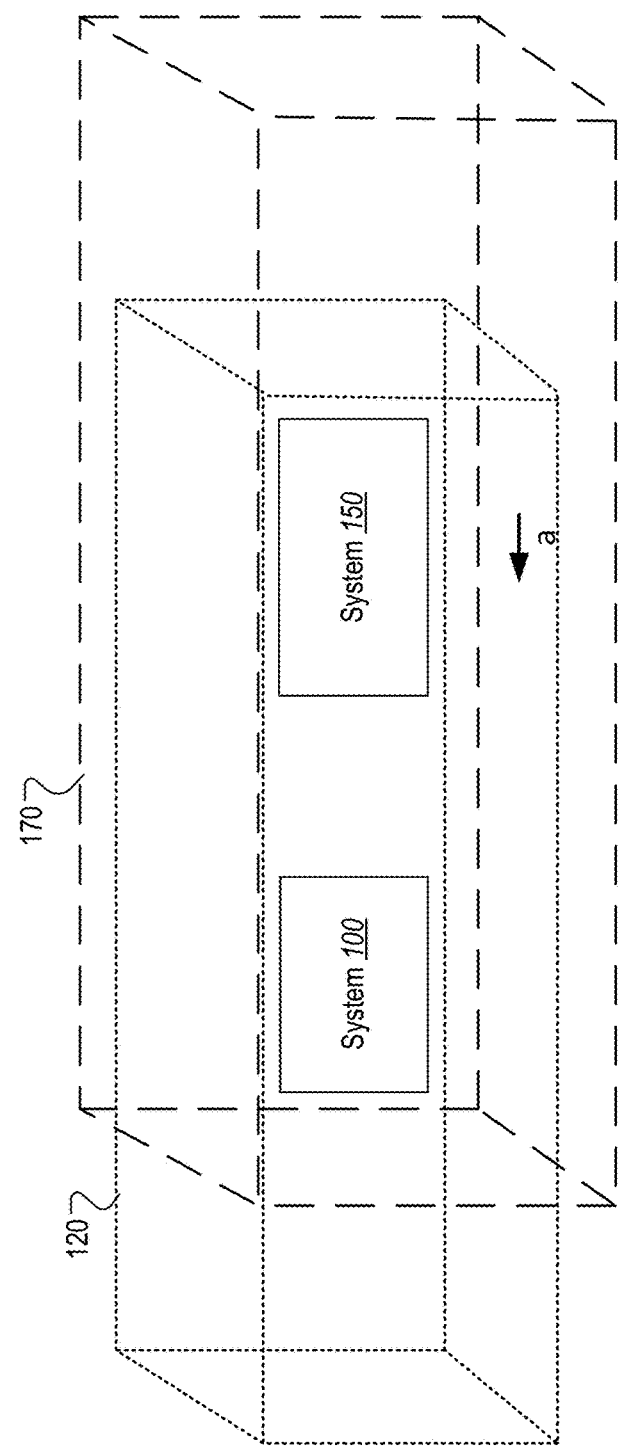

FIGS. 1A-1B illustrate schematic views of example configurations where two example EMT systems are positioned in proximity of each other. Each of these figures shows a first EMT system 100 and a second EMT system 150 in the proximity of the first system 100. Two systems being in proximity with each other means that the electromagnetic (EM) waves generated by a first one of the two systems is detectable by a second one of the two systems; e.g., the EM waves are detectable at the second system with high enough strength that they can potentially interfere with the electromagnetic waves generated by the second system and cause errors in operations (e.g., detecting pose and/or orientation) of the second system.

In the example configuration shown in FIG. 1A, the second system 150 is initially powered off. The magnetic transmitter of the first system 100 produces a first magnetic field at a first set of frequencies. The produced first magnetic field creates a tracking environment 120 around the first system 100. Within the tracking environment 120, the first magnetic field has a power (e.g., an RSSI value) greater than a threshold value. In other words, the first magnetic field may have a threshold power in order to prompt other systems positioned inside the magnetic field to consider selecting and/or adjusting their respective one or more operational frequencies.

When the second system 150 in FIG. 1A is turned on, the second system 150 checks to see whether it detects one or more frequencies that are already being used by other EMT systems, e.g., EMT systems that are in the proximity of the second system 150. Since the second system 150 is within the tracking environment 120 (or in the proximity of the first system 100), the second system 150 detects the EM waves produced by the first system 100. Based on the received EM waves, the second system 150 can determine what frequencies the first system 100 currently uses.

In response to determining frequencies that the first system 100 uses, the second system 150 choses a second set of frequencies (e.g., with at least one frequency different from frequencies in the first set of frequencies, but in some cases, with all frequencies being different from frequencies in the first set of frequencies) for communications between the second system 150's magnetic transmitter and magnetic sensor. By choosing a different set of frequencies than the ones that are already being used by the first system 100, the second system 150 eliminates or reduces a chance of interference between the electromagnetic waves produced by the first system 100 and the second system 150.

In addition, or alternatively, the second system 150 can check for status signals (or status information included in the status signals) received from other systems (e.g., the first system 100) to detect frequencies used by those other EMT systems. The status signals are described in more detail below with respect to FIG. 2. For example, using the status signals allows the second system 150 to determine frequencies used by other systems even if the second system 150 is not within the respective tracking environments of those other systems.

FIG. 1B shows a configuration where the two systems 100 and 150 are already turned on and operating. For example, each of the systems 100 and 150 may have been turned on when they were sufficiently far from each other—i.e., where the chance of interference from at least one of the two systems on the other one of the two systems was relatively low. Accordingly, each one of systems 100 and 150 may have selected a set of frequencies for its operation without regard to the set of frequencies that the other one of the two systems currently uses.

While the two systems operate sufficiently far from each other such that neither of them is in sufficient proximity (e.g., in the same tracking environment) of the other one, the two systems can select and use the same frequencies without interfering with each other. However, when at least one of the two systems gets close to the other system, the EM waves that the two systems generate may interfere with each other.

For example, in FIG. 1B, the second system 150 is moved (e.g., in direction a) towards the first system 100 and has entered the tracking environment 120 of the first system 100. If the first system 100 and the second system 150 are currently sharing at least one operating frequency, the electromagnetic field generated by the second system 150 at that shared frequency can interfere with the electromagnetic field generated by the magnetic transmitter of the first system 100, thereby causing distortions in the electromagnetic waves detected by magnetic sensors of the first system 100. Similarly, movement of the second system 150 towards the first system 100 can cause the first system 100 to enter the tracking environment 170 of the second system 150 and result in potential interference in operations of the second system 150.

To avoid an interference between the two systems, each of the first and the second systems can include one or more components that transmit status information of the system and receive such information from other systems. The status information of a system can include information of the frequencies that the system currently uses (e.g., at what frequencies the magnetic transmitter of the system generates EM fields), the uptime of the system at those frequencies, identification information of the system, information of the magnetic transmitter of the system, etc.

The status information of a system can be sent out as part of a status signal generated and transmitted by the system. The status signal can have a further transmission range than the EM waves generated by the system. In other words, the status signal generated for a system may be detected at a further distance from the system than a distance at which an EM wave generated by the system would be detected. For example, the first system 100 may generate an EM wave that creates the tracking environment 120 in a range of 20 meters (e.g., radius) from the first system 100, while the same system may generate a status signal detectable within 50 meters of the system. Thus, the transmission range for the status signal goes beyond the area covered by the tracking environment 120.

The first system 100 transmitting a status signal with a transmission range greater than a radius of the tracking environment 120 (e.g., the furthest distance that the first system's generated EM wave can be detected by another EMT system), allows the second system 150 to detect the status signal earlier and at a further distance from the first system 100 than a distance at which the EM wave generated by the first system 100 are detected. Based on the data included in the status signal, the second system 150 can determine whether it is using at least one frequency that is currently being used by the first system 100. If the second system 150 determines that it is sharing at least one frequency with the first system 100, the second system 150 can change its own frequency before moving into the proximity (e.g., into the tracking environment 120) of the first system 100. Communicating the status information between two EMT systems is further explained below with reference to FIG. 2.

Figure 2:
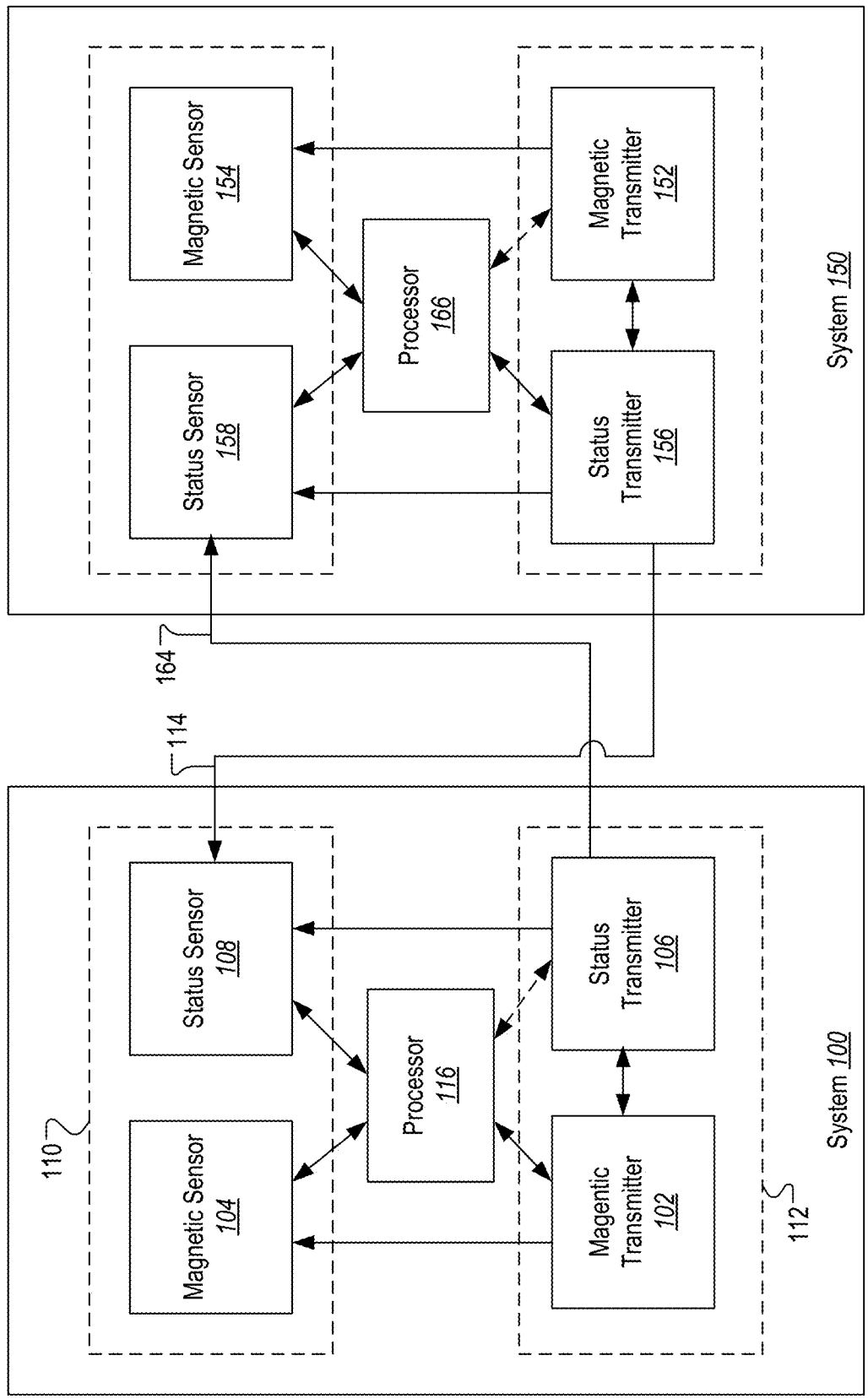
FIG. 2 depicts a schematic view of components in the EMT systems depicted in FIGS. 1A and 1B.

FIG. 2 illustrates a schematics of example components of the two EMT systems illustrated in any of FIGS. 1A and 1B. As illustrated, the first system 100 includes a magnetic transmitter 102, a magnetic sensor 104, a status transmitter 106, and a status sensor 108. The second system 150 includes a magnetic transmitter 152, an magnetic sensor 154, a status transmitter 156, and a status sensor 158.

The magnetic transmitter 102 and the magnetic sensor 104 are communicatively coupled such that electromagnetic waves generated by the magnetic transmitter 102 are detectable by the magnetic sensor 104. Similarly, the magnetic transmitter 152 and the magnetic sensor 154 are communicatively coupled such that electromagnetic waves generated by the magnetic transmitter 152 are detectable by the magnetic sensor 154.

The first system 100 also includes a status transmitter 106 that is communicatively coupled with a status sensor 108. The status transmitter 106 sends out (e.g., broadcasts) the status information of the system 100, for example, in a status signal. The status signal can include information of the operations of the first system 100 such as frequencies that the magnetic transmitter 102 currently uses, the magnetic transmitter 102's uptime while working at each of those frequencies, etc. The status transmitter 106 can be a wireless unit that sends out the status information on a local wireless network such as a Wi-Fi network, or over a short-distance distribution system such as a Bluetooth network. For example, the status transmitter 106 can be a Bluetooth low energy (BLE) radio.

Similar to the first system 100, the second system 150 has a status transmitter 156 communicatively coupled with its status sensor 158. The description above regarding the status transmitter 106 and status sensor 108 of the first system 100 applies to the status transmitter 156 and the status sensor 158 of the second system 150.

The status signal sent out by the status transmitter 106 can be received by the status sensor 108 of the first system 100, as well as, by status sensors of any other EMT systems that are within the transmission range of the first system 100. Since the transmission range of the status signal generated by a first system 100 is greater the furthest distance of the boarder of tracking environment 120 from the first system 100, any EMT system approaching the first system 100 can detect the status signal before detecting the EM wave generated by the first system 100.

For example, referring again to FIG. 1B, when the second system 150 moves towards the first system, the second system's 150 status sensor 158 can detect a status signal 164 generated by the status transmitter 106 of the first system 100 before moving into the tracking environment 120 of the first system 100. Similarly, when the second system 150 moves towards the first system 100, the status sensor 108 of the first system 100 can detect status information 114 generated by the status transmitter 156 of the second system 150 before any EM wave generated by the second system 150 has a chance to distort the EM waves generated by the first system 100 and interfere with the first system's 100 operations.

The first system 100 can compare information of the frequencies included in the status signal received from the second system 150, and determine whether the first and the second systems 100 and 150 currently share at least one frequency (or, e.g., have one or more frequencies within a threshold range of each other). For example, the status sensor 108 can send data related to the received status information to the processor 116 of the first system 100 for analysis and common frequency determination.

In some implementations, the status sensor 108 is capable of sending the status information to the processor 116. In some implementations, the status sensor 108 forwards any received signals to the processor 116, and the processor 116 filters out information that the status sensor 108 had received from the first system's status transmitter 106, e.g., to obtain only status information received from systems other than the first system 100.

The processor 116 analyzes the information it receives from the status sensor 108 to determine whether the system 100 needs to change its current operating frequency. If the processor 116 determines that the current frequency of the system 100 needs to be changed, the processor 116 sends a request to the magnetic transmitter 102 (e.g., indirectly via one or both of the status sensor 108 or the status transmitter 106) to switch its operating frequency.

When the processor 116 learns that the approaching second system 150 is using at least one frequency that is currently being used by the magnetic transmitter 102 (e.g., a "shared" frequency), the processor 116 may further analyze the status information received from the second system 150 to determine which one of the first system 100 and the second system 150 should change its current operating frequency. The processor 116 can perform such operation based on the respective uptimes that each of the first system 100 and the second system 150 has been operating on the shared frequency (or on two frequencies sufficiently close to each other that would potentially cause interference with EM waves generated by either of the two systems). For example, the processor 116 may determine that the magnetic transmitter 102 has been operating on a shared frequency $f_1$ for the past ten minutes, while the second system 150 has been working on the shared frequency $f_1$ for two minutes. By comparing the uptime of each of the two systems, the processor 116 can determine that since the second system 150 has been using the shared frequency $f_1$ for a shorter period of time, the second system 150 (e.g., rather than the first system 100) should change its operating frequency.

In some implementations, the processor 116 may determine that the system that has been using the shared frequency for a longer period of time should change its frequency. In some implementation, the processor 116 determines that the system that has been using the shared frequency for a shorter period of time should change its frequency. If the processor determines that the first system 100 should change its frequency, the processor 116 requests the magnetic transmitter 102 to change its operating frequency. If the processor 116 determines that the second system 150 should change its frequency, the processor 116 may initially not send a request to the magnetic transmitter 102 to change its operating frequency, and instead, may wait for the second system 150 to change its operating frequency on its own.

Assuming that the status sensor 158 has also received a status signal 164 from the status transmitter 106 and has forwarded its information to the processor 166 of the second system 150, both processors 116 and 166 should reach the same conclusion on which one of the first and the second systems 100 and 150 should change its frequency. However, miscommunications and/or malfunctions on at least one of the two systems may cause an inconsistency between a decision (or prediction) made by one of the two processors and how the other processor (or system) operates. For example, there may be a situation where the first system's processor 116 determines that between the first and the second systems, it is the second system 150 that needs to change its frequency. By relying on that decision, the processor 116 may not send a request for change of frequency to the magnetic transmitter 102 of the first system. On the other hand, the second system 150 may have missed a status signal from the first system 100, may have reached a different decision (e.g., determining that it is the first system 100 that needs to change its frequency), may be too slow in processing its information and making its respective determination, etc.

To alleviate such issues, the processor 116 can monitor (i) the EM waves sent by the magnetic transmitter 102 (e.g., in response to a user's change of position), and (ii) how the magnetic sensor 104 and/or other parts of the system 100 (e.g., an image created by the system in response to receiving the EM wave) responds to those EM waves. For example, the processor 116 can be part of (and/or be connected to) an internal measurement unit (IMU) implemented on the first system 100 to monitor the waves and/or signals generated by the first system, and/or reactions of different parts of the first system to those waves and/or signals.

If the processor 116 determines an inconsistency between the generated wave/signal and a reaction of the first system to the generated wave/signal, the processor 116 can determine that an interference has occurred and request the magnetic transmitter 102 to change its operating frequency. For example, based on the generated wave/signal, the IMU can determine how one or more components of the first system 100 should react to the generated wave/signal. When the processor 116 determines a divergence between a reaction of at least one component (e.g., a pose) to the generated wave/signal and an expected reaction determined by the IMU, the processor 116 determines that an interference has likely occurred and sends a request to the magnetic transmitter 102 to change its frequency.

In some implementations, to prevent an interference, for example, in an instance of a malfunction or a miscommunication between two EMT systems, the processor 116 may request the magnetic transmitter 102 to change its frequency before the second system 150 gets too close to the first system 100, e.g., before the second system moves into the tracking environment 120 of the first system 100. When the processor 116 determines that it is the other system (i.e., second system 150) that should change its operating frequency, the processor 116 can monitor the status information subsequently received from the second system 150 to determine whether the second system 150 has changed its frequency. If the subsequent status information received from the second system 150 indicates that the second system 150 has not changed its frequency for a predetermined period of time (e.g., 30 seconds), the processor 116 may request the magnetic transmitter 102 to change its operating frequency.

In some implementations, if the subsequent status information received from the second system 150 indicates that the second system 150 has not changed its frequency, the processor 116 may review signal strength (e.g., through received signal strength indicator (RSSI)) of the status signal received from the second system 150 to determine how close the second system is to the first system. If, based on the strength of the status signal, the processor 116 determines that the signal is getting stronger (e.g., compared to a status signal previously received from the second system), the processor 116 can conclude that the second system 150 is getting closer to the first system 100, and may request the magnetic transmitter 102 to change its frequency.

Alternatively, or in addition, the processor 116 may request the magnetic transmitter to change its frequency in response to determining that the signal strength is greater than a threshold strength, and/or in response to determining that the second system 150 is getting closer than a predetermined threshold distance from the first system 100. If the processor 116 determines that the second system 156 is getting closer than the threshold distance, the processor 116 may conclude that the second system 156 is close enough to the first system to potentially cause an interference (e.g., currently or in the future). For example, based on the signal strength, the processor 116 may determine that the system 150 is likely 30 to 40 meters away from the system 100, and thus, is too far from the first system when the first system has a tracking environment 120 with a radius of only, for example, 10 meters, but may potentially cause interference in future when the first system has a tracking environment radius of 35 meters.

In some implementations, the processor 116 may analyze the signal strength of the status signal received from the second system 150 before determining whether or not the second system shares a frequency with the first system. For example, upon determining that the second system 150 is too far from the first system 100, the processor 116 can skip analyzing information of the status signal received from the second system 150. Such configuration reduces processing burden on the processor 116 and improves its processing speed for other analyses, e.g., analyzing information of status signals received from other systems, controlling and/or synchronizing transmitters with their respective sensors, monitoring the IMU, etc.

In some implementations, the processor 116 also determines the safe frequency (or frequencies) to which the magnetic transmitter 102 should switch and sends information of that safe frequency to the magnetic transmitter. For example, the processor 116 may compare the frequencies obtained from the status signal received from the second system 156, to a list of frequencies and/or a list of frequency bands to determine unused frequencies and/or less crowded frequency bands. The processor 116 may then select one or more frequencies from the list and forward the selected frequencies to the magnetic transmitter 102.

Each frequency band can include one or more particular frequencies (or frequency sets) among which the frequencies for the magnetic transmitter 102's operation can be selected. For example, a frequency band can be any frequency range between 20 KHz and 60 KHz (e.g., 24-42 KHz) and can include more than twenty frequency sets (e.g., 23 frequency sets, 30 frequency sets, etc.).

In some implementations, the processor 116 considers the electromagnetic noise floor to select the one or more safe frequencies. For example, if no other system is using a particular frequency, but there is a lot of noise on that particular frequency, the processor 116 eliminates that particular frequency from its list of safe frequencies. The processor 116 can consider the electromagnetic noise floor in each candidate frequency and/or candidate frequency bands (e.g., a white noise in the environment) for selecting the safe frequencies.

When determining one or more safe frequencies for the magnetic transmitter 102 to switch to, the processor 116 can use a frequency domain algorithm to scan for frequencies that will not interfere with the frequencies currently being used by other systems (e.g., the second system 150) that are in proximity, or getting close to the proximity of the first system 100. The frequency domain algorithm can include a Fast Fourier Transform (FFT) analysis of the currently used frequencies.

In some implementations, the processor 116 repeatedly changes the safe frequency that it sends to the magnetic transmitter 102. For example, the processor 116 can select a frequency from the determined one or more safe frequencies every 10 seconds and send the selected frequency to the magnetic transmitter 102.

To improve the system processing speed, the possibility of interference may be determined periodically rather than continuously. For example, the processor 116 may analyze information related to the received status signals in a period between every 20 millisecond and 10 seconds. In addition, or alternatively, the status transmitter 106 may generate and send its status signal on a periodic basis (e.g., between every 20 milliseconds and 10 seconds) and/or the status sensor 108 may receive status signals from the status transmitter 106 and/or any other EMT system that has sent a status signal on a periodic basis.

In some examples, (e.g., in the implementation illustrated in FIG. 2), the status signal is generated by the status transmitters 106 and 156 respectively located on the first system 100 and the second system 156, and the status signal is received by the status sensors 108 and 158 respectively located on the first system 100 and the second system 156. In some implementations, at least one of the status transmitter or the status sensor is physically separate from the EMT systems (e.g., in a room where the EMT systems are positioned) and is in communication with the processors of the EMT systems. Such status transmitter and/or status signal can have a coverage area to receive and/or transmit status information of any EMT systems that is within the coverage area. The coverage area can be broader than the tracking environment of any individual EMT system existing within the coverage area.

FIG. 3 depicts an example of an EMT system 300 that can be used as part of an AR/VR system. The EMT system 300 includes at least a head-mounted display (HMD) 302 and a controller 304. The HMD 302 includes a magnetic sensor 312 and an inertial measurement unit (IMU) 322. The controller 304 that includes a magnetic transmitter 314 and another IMU 324.

Either or both of the first system 100 and the second system 150 illustrated in FIGS. 1A-1B and FIG. 2 can be implemented by the EMT system 300. For example, section 112 of first system 100 can be implemented on the controller 304, and section 110 of the first system 100 can be implemented on the HMD 302. The processor 116 can be implemented on any of the controller 304 or the HMD 302.

The EMT system 300 operates in a tracking environment 306. The tracking environment 306 may be visualization of an arbitrary space intended to represent a volume in which the EMT system 300 operates. In some implementations, the tracking environment 306 may represent an area throughout which electromagnetic waves are transmitted and received by components of the EMT system 300. In some implementations, multiple different EMT systems may operate in the same tracking environment 306.

In some implementations, a VR system uses computer technology to simulate the user's physical presence in a virtual or imaginary environment. VR systems may create three-dimensional images and/or sounds through the HMD 302 and tactile sensations through haptic devices in the controller 304 or wearable devices to provide an interactive and immersive computer-generated sensory experience. In contrast, AR systems may overlay computer-generated sensory input atop the user's live experience to enhance the user's perception of reality. For example, AR systems may provide sound, graphics, and/or relevant information (e.g., such as GPS data to the user during a navigation procedure). Mixed Reality (MR) systems—sometimes referred to as hybrid reality systems—may merge real and virtual worlds to produce new environments and visualizations where physical and digital objects co-exist and interact in real-time.

The HMD 302 and the controller 304 are configured to track position (e.g., in x, y, and z) and orientation (e.g., in azimuth, altitude, and roll) in three-dimensional space relative to each other. For example, the transmitter 314 is configured to track the sensor 312 (e.g., relative to a reference frame defined by the position and orientation of the transmitter 314), and/or the sensor 312 is configured to track the transmitter 314 (e.g., relative to a reference frame defined by the position and orientation of the sensor 312).

In some implementations, the system 300 is configured to track the pose (e.g., the position and orientation—sometimes referred to as the P&O) of the sensor 312 and/or the transmitter 314 in the tracking environment 306 of the EMT system 300. In this way, the pose of the HMD 302 and/or the controller 304 can be tracked relative to each other and relative to a coordinate system defined by the EMT system 300. For example, the HMD 302 and the controller 304 can be used to perform head, hand, and/or body tracking, for example, to synchronize the user's movement with the AR/VR content.

While the tracking environment 306 is illustrated as being a defined space, it should be understood that the tracking environment 306 may be any three-dimensional space, including three-dimensional spaces without boundaries (e.g., large indoor and/or outdoor areas, etc.). The particular sensor 312 and transmitter 314 employed by the EMT system 300 may be determined by the procedure type, measurement performance requirements, etc.

In some implementations, the transmitter 314 includes three orthogonally wound magnetic coils, referred to herein as the X, Y, and Z coils. Electrical currents traveling through the three coils cause the coils to produce three orthogonal sinusoidal magnetic fields at a particular frequency (e.g., the same or different frequencies). In some implementations, time division multiplexing (TDM) may also be used. For example, in some implementations, the coils may produce magnetic fields at the same frequency (e.g., 30 KHz) but at non-overlapping times. The sensor 312 also includes three orthogonally wound magnetic coils, referred to herein as the x, y, and z coils.

Voltages are induced in the coils of the sensor 312 in response to the sensed magnetic fields by means of magnetic induction. Each coil of the sensor 312 generates an electrical signal for each of the magnetic fields generated by the coils of the transmitter 314; for example, the x coil of the sensor 312 generates a first electrical signal in response to the magnetic field received from the X coil of the transmitter 314, a second electrical signal in response to the magnetic field received from the Y coil of the transmitter 314, and a third electrical signal in response to the magnetic field received from the Z coil of the transmitter 314. They and z coils of the sensor 312 similarly generate electrical signals for each of the magnetic fields generated by the X, Y, and Z coils of the transmitter 314 and received at/by they and z coils of the sensor 312.

The data from the sensor 312 can be represented as a matrix of data (e.g., a 3×3 matrix), sometimes referred to as a measurement matrix, which can be resolved into the pose of the sensor 312 with respect to the transmitter 314, or vice versa. In this way, the pose of the sensor 312 and the transmitter 314 is measured. In some implementations, calculations used to determine the pose information are performed at the controller 304 and/or at the HMD 302. In some implementations, the calculations are performed at a separate computer system, such as a computing device that is in wired or wireless communication with the sensor 312 and/or the transmitter 314.

As described above with respect to FIG. 2, the AR/VR system and/or the EMT system 300 can employ one or more techniques for improving the determination of the pose of the sensor 312 relative to the transmitter 314. For example, one or more techniques may be employed to reduce/eliminate pose errors caused by interference between multiple EMT systems operating in sufficiently close proximity to each other.

Figure 4:
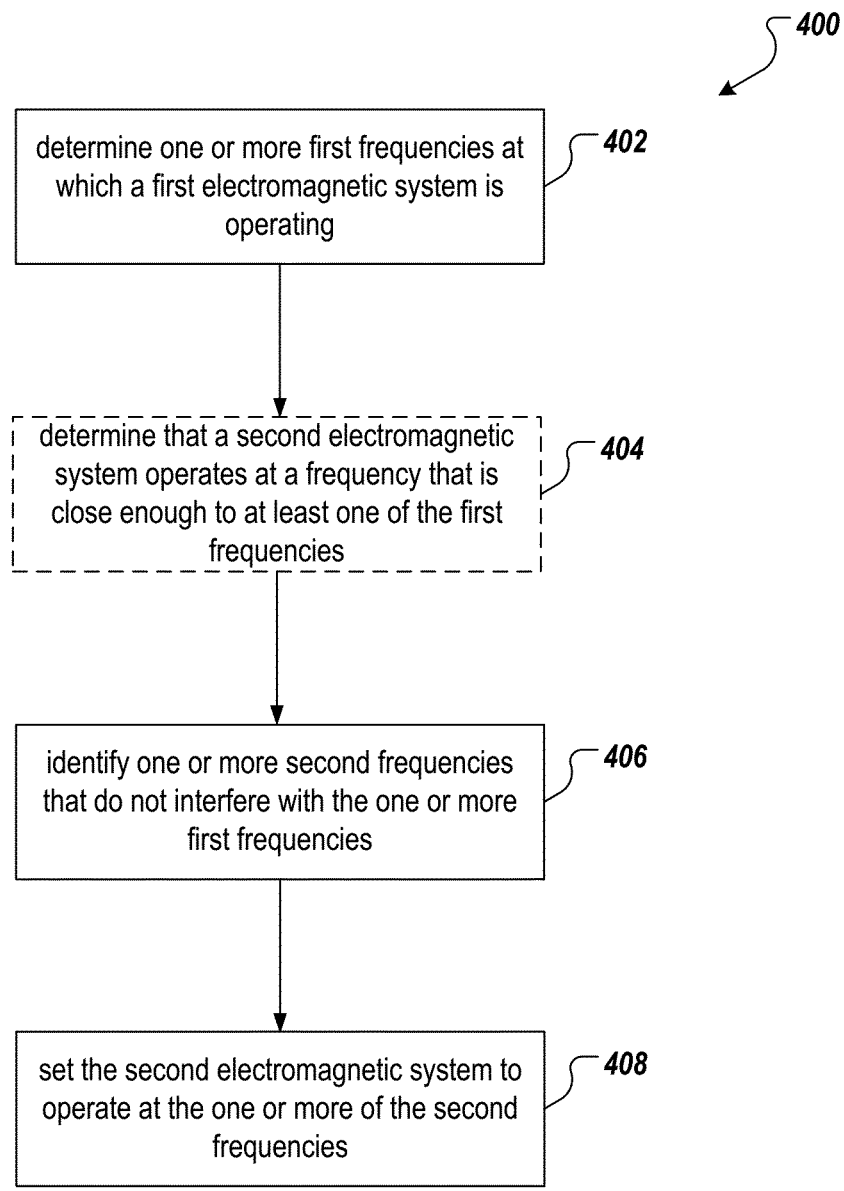
FIG. 4 shows a flowchart of an exemplary process of selecting a frequency for an EMT system.

FIG. 4 is a flowchart of an exemplary process 400 of selecting one or more operating frequencies for one or more EMT systems (e.g., the EMT systems 100, 150 of FIG. 2). One or more steps of the method may be performed by the one or more computer systems described herein.

One or more first frequencies at which a first electromagnetic system is operating is determined (402). For example, the first frequencies can be determined based on a status signal received from the first system 100. The status signal can be received by a status sensor 158 of the second system 150 of FIG. 2, and can be analyzed by the processor 166 of the second system 150.

One or more second frequencies that do not interfere with the first frequencies are identified (406). In some implementations, the second frequencies are determined when a second electromagnetic system (e.g., the second system 150) is being turned on. In some implementations, the second frequencies are determined in response to determining that a second electromagnetic system (e.g., the second system 150) operates at a frequency that is close enough to at least one of the first frequencies (404). The one or more second frequencies can be identified by a processor, for example by a processor of the second electromagnetic system.

The second electromagnetic system is set to operate at the one or more second frequencies (408). For example, in response to determining that the magnetic transmitter 152 is operating on at least one frequency that would likely interfere with one or more of the first frequencies, the processor 166 may request the magnetic transmitter 152 of the second system 156 to operate at a different frequency to avoid and/or reduce the chance of interference with operations of the first electromagnetic system.

As described above, the EMT systems 100, 150, 300 can be operated using software executed by a computing device, such as one or more computer systems operating on the HMD 302/sensor 312 and/or the controller 304/transmitter 314, and/or one or more separate computer systems in communication with the sensor 312 and the transmitter 314. In some implementations, the software is included on a computer-readable medium for execution on the one or more computer systems.

Figure 5:
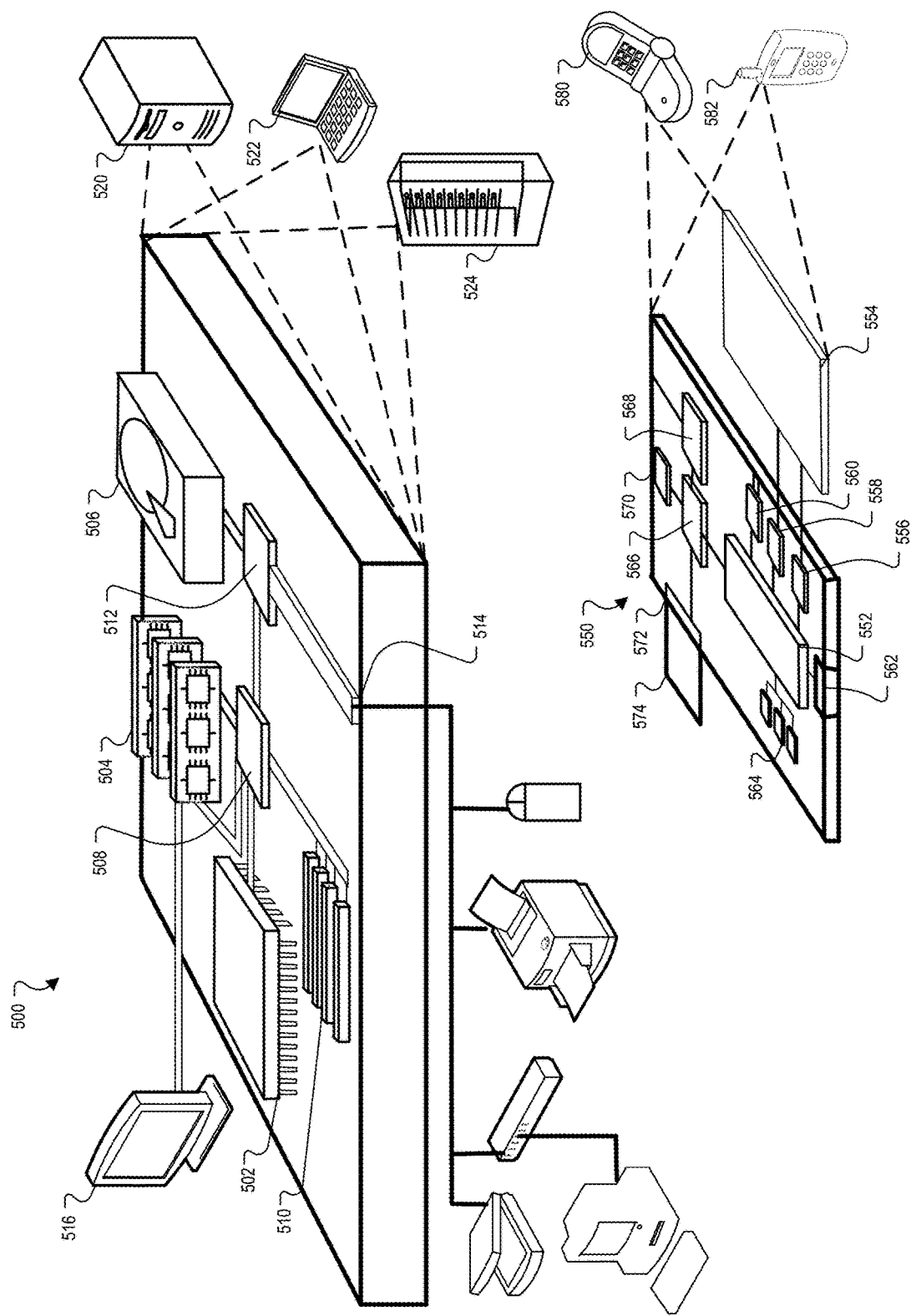
FIG. 5 shows an example of a computing device and a mobile computing device that can be used to implement the techniques described herein.

FIG. 5 shows an example computing device 500 and an example mobile computing device 550, which can be used to implement the techniques described herein. For example, determining and/or adjusting one or more operating frequencies of the various EMT systems may be executed and controlled by the computing device 500 and/or the mobile computing device 550. Computing device 500 is intended to represent various forms of digital computers, including, e.g., laptops, desktops, workstations, personal digital assistants, servers, blade servers, mainframes, and other appropriate computers. Computing device 550 is intended to represent various forms of mobile devices, including, e.g., personal digital assistants, cellular telephones, smartphones, and other similar computing devices. The components shown here, their connections and relationships, and their functions, are meant to be examples only, and are not meant to limit implementations of the techniques described and/or claimed in this document.

Computing device 500 includes processor 502, memory 504, storage device 506, high-speed interface 508 connecting to memory 504 and high-speed expansion ports 510, and low speed interface 512 connecting to low speed bus 514 and storage device 506. Each of components 502, 504, 506, 508, 510, and 512, are interconnected using various busses, and can be mounted on a common motherboard or in other manners as appropriate. Processor 502 can process instructions for execution within computing device 500, including instructions stored in memory 504 or on storage device 506, to display graphical data for a GUI on an external input/output device, including, e.g., display 516 coupled to high-speed interface 508. In some implementations, multiple processors and/or multiple buses can be used, as appropriate, along with multiple memories and types of memory. In addition, multiple computing devices 500 can be connected, with each device providing portions of the necessary operations (e.g., as a server bank, a group of blade servers, a multi-processor system, etc.).

Memory 504 stores data within computing device 500. In some implementations, memory 504 is a volatile memory unit or units. In some implementation, memory 504 is a non-volatile memory unit or units. Memory 504 also can be another form of computer-readable medium, including, e.g., a magnetic or optical disk.

Storage device 506 is capable of providing mass storage for computing device 500. In some implementations, storage device 506 can be or contain a computer-readable medium, including, e.g., a floppy disk device, a hard disk device, an optical disk device, a tape device, a flash memory or other similar solid state memory device, or an array of devices, including devices in a storage area network or other configurations. A computer program product can be tangibly embodied in a data carrier. The computer program product also can contain instructions that, when executed, perform one or more methods, including, e.g., those described above with respect to determining and/or adjusting distortion terms and determining the P&O of the sensor 112. The data carrier is a computer- or machine-readable medium, including, e.g., memory 504, storage device 506, memory on processor 502, and the like.

High-speed controller 508 manages bandwidth-intensive operations for computing device 500, while low speed controller 512 manages lower bandwidth-intensive operations. Such allocation of functions is an example only. In some implementations, high-speed controller 508 is coupled to memory 504, display 516 (e.g., through a graphics processor or accelerator), and to high-speed expansion ports 510, which can accept various expansion cards (not shown). In some implementations, the low-speed controller 512 is coupled to storage device 506 and low-speed expansion port 514. The low-speed expansion port, which can include various communication ports (e.g., USB, Bluetooth®, Ethernet, wireless Ethernet), can be coupled to one or more input/output devices, including, e.g., a keyboard, a pointing device, a scanner, or a networking device including, e.g., a switch or router (e.g., through a network adapter).

Computing device 500 can be implemented in a number of different forms, as shown in FIG. 5. For example, the computing device 500 can be implemented as standard server 520, or multiple times in a group of such servers. The computing device 500 can also can be implemented as part of rack server system 524. In addition or as an alternative, the computing device 500 can be implemented in a personal computer (e.g., laptop computer 522). In some examples, components from computing device 500 can be combined with other components in a mobile device (e.g., the mobile computing device 550). Each of such devices can contain one or more of computing device 500, 550, and an entire system can be made up of multiple computing devices 500, 550 communicating with each other.

Computing device 550 includes processor 552, memory 564, and an input/output device including, e.g., display 554, communication interface 566, and transceiver 568, among other components. Device 550 also can be provided with a storage device, including, e.g., a microdrive or other device, to provide additional storage. Components 550, 552, 564, 554, 566, and 568, may each be interconnected using various buses, and several of the components can be mounted on a common motherboard or in other manners as appropriate.

Processor 552 can execute instructions within computing device 550, including instructions stored in memory 564. The processor 552 can be implemented as a chipset of chips that include separate and multiple analog and digital processors. The processor 552 can provide, for example, for the coordination of the other components of device 550, including, e.g., control of user interfaces, applications run by device 550, and wireless communication by device 550.

Processor 552 can communicate with a user through control interface 558 and display interface 556 coupled to display 554. Display 554 can be, for example, a TFT LCD (Thin-Film-Transistor Liquid Crystal Display) or an OLED (Organic Light Emitting Diode) display, or other appropriate display technology. Display interface 556 can comprise appropriate circuitry for driving display 554 to present graphical and other data to a user. Control interface 558 can receive commands from a user and convert them for submission to processor 552. In addition, external interface 562 can communicate with processor 542, so as to enable near area communication of device 550 with other devices. External interface 562 can provide, for example, for wired communication in some implementations, or for wireless communication in some implementations. Multiple interfaces also can be used.

Memory 564 stores data within computing device 550. Memory 564 can be implemented as one or more of a computer-readable medium or media, a volatile memory unit or units, or a non-volatile memory unit or units. Expansion memory 574 also can be provided and connected to device 550 through expansion interface 572, which can include, for example, a SIMM (Single In Line Memory Module) card interface. Such expansion memory 574 can provide extra storage space for device 550, and/or may store applications or other data for device 550. Specifically, expansion memory 574 can also include instructions to carry out or supplement the processes described above and can include secure data. Thus, for example, expansion memory 574 can be provided as a security module for device 550 and can be programmed with instructions that permit secure use of device 550. In addition, secure applications can be provided through the SIMM cards, along with additional data, including, e.g., placing identifying data on the SIMM card in a non-hackable manner.

The memory 564 can include, for example, flash memory and/or NVRAM memory, as discussed below. In some implementations, a computer program product is tangibly embodied in a data carrier. The computer program product contains instructions that, when executed, perform one or more methods, including, e.g., those described above with respect to determining and/or adjusting distortion terms and determining the P&O of the sensor 112. The data carrier is a computer- or machine-readable medium, including, e.g., memory 564, expansion memory 574, and/or memory on processor 552, which can be received, for example, over transceiver 568 or external interface 562.

Device 550 can communicate wirelessly through communication interface 566, which can include digital signal processing circuitry where necessary. Communication interface 566 can provide for communications under various modes or protocols, including, e.g., GSM voice calls, SMS, EMS, or MMS messaging, CDMA, TDMA, PDC, WCDMA, CDMA2000, or GPRS, among others. Such communication can occur, for example, through radio-frequency transceiver 568. In addition, short-range communication can occur, including, e.g., using a Bluetooth®, WiFi, or other such transceiver (not shown). In addition, GPS (Global Positioning System) receiver module 570 can provide additional navigation- and location-related wireless data to device 550, which can be used as appropriate by applications running on device 550.

Device 550 also can communicate audibly using audio codec 560, which can receive spoken data from a user and convert it to usable digital data. Audio codec 560 can likewise generate audible sound for a user, including, e.g., through a speaker, e.g., in a handset of device 550. Such sound can include sound from voice telephone calls, recorded sound (e.g., voice messages, music files, and the like) and also sound generated by applications operating on device 550.

Computing device 550 can be implemented in a number of different forms, as shown in FIG. 5. For example, the computing device 550 can be implemented as cellular telephone 580. The computing device 550 also can be implemented as part of smartphone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include one or more computer programs that are executable and/or interpretable on a programmable system. This includes at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to a computer program product, apparatus and/or device (e.g., magnetic discs, optical disks, memory, Programmable Logic Devices (PLDs)) used to provide machine instructions and/or data to a programmable processor, including a machine-readable medium that receives machine instructions. In some implementations, the memory, storage devices, machine-readable medium and/or computer-readable medium is non-transitory.

To provide for interaction with a user, the systems and techniques described herein can be implemented on a computer having a display device (e.g., a CRT (cathode ray tube) or LCD (liquid crystal display) monitor) for presenting data to the user, and a keyboard and a pointing device (e.g., a mouse or a trackball) by which the user can provide input to the computer. Other kinds of devices can be used to provide for interaction with a user as well. For example, feedback provided to the user can be a form of sensory feedback (e.g., visual feedback, auditory feedback, or tactile feedback). Input from the user can be received in a form, including, acoustic, speech, or tactile input.

The systems and techniques described here can be implemented in a computing system that includes a backend component (e.g., as a data server), or that includes a middleware component (e.g., an application server), or that includes a frontend component (e.g., a client computer having a user interface or a Web browser through which a user can interact with an implementation of the systems and techniques described here), or a combination of such backend, middleware, or frontend components. The components of the system can be interconnected by a form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the components described herein can be separated, combined or incorporated into a single or combined component. The components depicted in the figures are not intended to limit the systems described herein to the software architectures shown in the figures.

A number of embodiments have been described. Nevertheless, it will be understood that various modifications may be made without departing from the spirit and scope of the disclosure. Accordingly, other embodiments are within the scope of the following claims.

What is claimed is:

1. A method comprising:
   determining one or more first frequencies at which a first electromagnetic system is operating, wherein the first electromagnetic system includes a magnetic transmitter configured to generate magnetic fields and a magnetic sensor configured to generate signals based on characteristics of the magnetic fields received at the magnetic sensor;
   identifying one or more second frequencies that do not interfere with the determined one or more first frequencies; and
   setting a second electromagnetic system to operate at the identified one or more second frequencies;
   wherein the one or more second frequencies are identified in response to determining that the second electromagnetic system operates at a frequency that is within a threshold value of at least one of the first frequencies such that an interference between operations of the first electromagnetic system and the second electromagnetic system would result.

2. The method of claim 1, further comprising:
   receiving, from the first electromagnetic system, a status signal, wherein information related to one or more first frequencies is included in the status signal,
   wherein the one or more second frequencies are identified based on the status signal.

3. The method of claim 2, wherein the one or more second frequencies are identified in response to determining that a received signal strength indicator (RSSI) value corresponding to the status signal received from the first electromagnetic system is greater than a threshold value.

4. The method of claim 1, wherein identifying the one or more second frequencies includes identifying a frequency that is greater than or less than at least one of the first one or more frequencies by at least a threshold amount.

5. The method of claim 1, wherein identifying the one or more second frequencies includes using a frequency domain algorithm to scan for frequencies that will not interfere with the determined one or more frequencies.

6. The method of claim 5, wherein the frequency domain algorithm is a Fast Fourier Transform (FFT).

7. The method of claim 6, wherein setting the second electromagnetic system to operate at the identified one or more second frequencies includes repeatedly changing between the one or more second frequencies.

8. The method of claim 1, wherein the one or more second frequencies are identified at least in part based on measurements received by an inertial measurement unit (IMU).

9. The method of claim 8, wherein identifying the one or more second frequencies includes determining a divergence between a pose determined based on the magnetic fields and a pose determined based at least in part on measurements received from the IMU.

10. The method of claim 1, wherein the one or more second frequencies are between 24 to 42 kHz.

11. The method of claim 1, wherein the magnetic transmitter includes three coils each operating at a particular frequency.

12. The method of claim 1, wherein the one or more frequencies are identified between every 20 milliseconds and every 10 seconds.

13. A system comprising:
    a status sensor configured to receive a status signal from a first electromagnetic system, the first electromagnetic system including a magnetic transmitter configured to generate magnetic fields and a magnetic sensor configured to generate signals based on characteristics of the magnetic fields received at the magnetic sensor; and
    a computing device configured to:
       determine, from the status signal, one or more first frequencies at which the first electromagnetic system is operating,
       identify one or more second frequencies that do not interfere with the determined one or more first frequencies, and
       send, to a magnetic transmitter of a second electromagnetic system, a request to operate at the identified one or more second frequencies;
    wherein the computing device identifies the one or more second frequencies in response to determining that the second electromagnetic system operates at a frequency that is within a threshold value of at least one of the first frequencies such that an interference between operations of the first electromagnetic system and the second electromagnetic system would result.

14. The system of claim 13, wherein the computing device is part of the second electromagnetic system.

15. The system of claim 13, wherein the computing device is in wireless communication with one or both of the first electromagnetic system or the second electromagnetic system.

16. The system of claim 13, wherein the status signal is generated by the first electromagnetic system and based on a communication protocol that has a communication range that is greater than a detection range of the magnetic fields generated by the magnetic transmitter of the first electromagnetic system.

* * * * *